United States Patent
Prall

(10) Patent No.: US 6,442,066 B1
(45) Date of Patent: Aug. 27, 2002

(54) FLASH MEMORY WITH OVERERASE PROTECTION

(75) Inventor: Kirk D. Prall, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/940,979

(22) Filed: Aug. 28, 2001

Related U.S. Application Data

(62) Division of application No. 09/212,467, filed on Dec. 16, 1998, now Pat. No. 6,282,126.

(51) Int. Cl.[7] ............................................. G11C 16/04
(52) U.S. Cl. ............................ 365/185.01; 365/185.29
(58) Field of Search ...................... 365/185.01, 185.29, 365/185.3, 185.12, 185.26

(56) References Cited

U.S. PATENT DOCUMENTS

| | | | |
|---|---|---|---|
| 4,809,225 A | 2/1989 | Dimmler et al. | 365/145 |
| 4,873,664 A | 10/1989 | Eaton | 365/145 |
| 4,888,733 A | 12/1989 | Mobley | 365/145 |
| 4,888,734 A | 12/1989 | Lee et al. | 365/185 |
| 5,010,518 A | 4/1991 | Toda | 365/145 |
| 5,086,412 A | 2/1992 | Jaffe et al. | 365/145 |
| 5,097,444 A * | 3/1992 | Fong | 365/185 |
| 5,218,566 A | 6/1993 | Papaliolios | 365/145 |
| 5,254,482 A | 10/1993 | Fisch | 437/8 |
| 5,297,077 A | 3/1994 | Imai et al. | 365/145 |
| 5,305,273 A | 4/1994 | Jinbo | 365/210 |
| 5,424,975 A | 6/1995 | Lowrey | 365/145 |
| 5,432,731 A | 7/1995 | Kirsch et al. | 365/145 |
| 5,487,029 A | 1/1996 | Kuroda | 365/145 |
| 5,508,959 A | 4/1996 | Lee et al. | 365/185.3 |
| 5,619,454 A | 4/1997 | Lee et al. | 365/185.3 |
| 5,627,784 A | 5/1997 | Roohparvar | 365/189.01 |
| 5,631,864 A | 5/1997 | Briner | 365/185.05 |
| 5,633,822 A | 5/1997 | Campardo et al. | 365/185.02 |
| 5,646,429 A | 7/1997 | Chevallier | 257/316 |
| 5,687,117 A | 11/1997 | Chevallier et al. | 365/185.12 |
| 5,748,538 A * | 5/1998 | Lee et al. | 365/185.06 |
| 5,966,325 A * | 10/1999 | Nakanishi et al. | 365/185.01 |
| 6,058,043 A | 5/2000 | Houdt et al. | 365/185.14 |

FOREIGN PATENT DOCUMENTS

| | | | | |
|---|---|---|---|---|
| EP | 0364813 | 4/1990 | | G11C/11/22 |
| JP | 3-59960 | 1/1991 | | G11C/17/04 |

OTHER PUBLICATIONS

Kinney, W., et al., "Memory applications of integrated ferroelectric technology", *Digest of Technical Papers*, 266–267 (1994),.

Moazzami, R., et al., "A Ferroelectric Dram Cell For High Density Nvrams", *1990 Symposium on VLSI Technology*, pp. 15–17, (1990).

Sumi, T., et al., "A 256kb Nonvolatile Ferroelectric Memory at 3V and 100ns", *IEEE Intl. Solid State Circuits Conf., Digest of Technical Papers*, 268–269,350, (1994).

* cited by examiner

*Primary Examiner*—Richard Elms
*Assistant Examiner*—Anh Phung
(74) *Attorney, Agent, or Firm*—Schwegman, Lundberg, Woessner & Kluth, P.A.

(57) ABSTRACT

A non-volatile memory is described which includes an array of memory cells arranged in rows and columns. A split source line architecture is implemented and uses isolation transistors located throughout the memory array to couple selected memory cells in response to an active row line signal. The isolation transistors can be provided for each row of the memory array or for a pre-determined number of memory cells, such as 8, 16 or 32. By providing a split source line and isolation transistors, read errors caused by over erased memory cells can be eliminated with minimal increase in die area.

25 Claims, 8 Drawing Sheets

FLASH MEMORY WITH OVERERASE PROTECTION

This application is a Divisional of U.S. application Ser. No. 09/212,467, filed Dec. 16, 1998, now U.S. Pat. No. 6,282,126, issued Aug. 28, 2001.

TECHNICAL FIELD OF THE INVENTION

The present invention relates generally to static data storage a in particular the present invention relates to a non-volatile flash memory device.

BACKGROUND OF THE INVENTION

A flash memory device is a non-volatile memory, derived from erasable programmable read-only memory (EPROM) and electrically-erasable programmable read-only memory (EEPROM). Flash memory is being increasingly used to store execution codes and data in portable electronic products, such as computer systems.

A typical flash memory comprises a memory array having a large number of memory cells arranged in blocks. Each of the memory cells is fabricated as a field-effect transistor having a control gate and a floating gate. The floating gate is capable of holding a charge, and is separated, by a layer of thin oxide, from source and drain regions contained in a substrate. Each of the memory cells can be electrically programmed (charged) by injecting electrons from the drain region through the oxide layer onto the floating gate. The charge can be removed from the floating gate by tunneling the electrons to the source through the oxide layer during an erase operation. Thus the data in a memory cell is determined by the presence or absence of a charge on the floating gate.

Flash memories have a typical operating voltage in the range of about 1.8 to 5 volts. A high voltage, however, is usually required for programming and erase operations in a flash memory. This high voltage (Vpp) is in the range of 10 to 13 volts, but can be higher. During a programming operation, electrons are injected onto the floating gate by applying the high voltage (Vpp) to the control gate and about one-half Vpp to the drain region while the source region is grounded. Electron tunneling from the floating gate during an erase operation is accomplished by applying Vpp to the source region, connecting the control gate to ground potential and leaving the drain region electrically unconnected or floating. Alternately, a large negative voltage could be applied to the gate and a higher voltage applied to the source to perform a negative gate erase operation.

The construction and operation of a basic stacked floating gate memory cell is described with reference to FIGS. 1A, 1B and 1C. FIG. 1A is a cross-sectional view of a typical floating gate memory cell used in flash memories. Memory cell 100 comprises a source region 102 and a drain region 104. Source 102 and drain 104 are constructed from N+type regions formed in a P-type semiconductor substrate 106. Source 102 and drain 104 are separated by a channel region 108. Memory cell 100 further includes a floating gate 110 formed by a first polysilicon (poly) layer, and a control gate 114 formed by a second poly layer. Floating gate 110 is isolated from control gate 114 by an interpoly dielectric layer 112 and from channel region 108 by a thin gate oxide layer 116. The source region 102 has a deeper junction than the drain region 104 for improving erase operations.

FIG. 1B is the memory cell of FIG. 1A during a programming operation. To program the memory cell to store a charge, a positive programming voltage of about 12 volts is applied to control gate 114. This positive programming voltage attracts electrons 120 from P-type substrate 106 and causes them to accumulate toward the surface of channel region 108. The drain 104 voltage is increased to about 5 volts, and source 102 is connected to ground. As the drain-to-source voltage increases, electrons 120 begin to flow from source 102 to drain 104 via channel region 108. Electrons 120 acquire substantially large kinetic energy and are referred to as hot electrons.

The voltage difference between control gate 114 and drain 104 creates an electric field through oxide layer 116, this electric field attracts the hot electrons and accelerates them towards floating gate 110. Floating gate 110 starts to trap and accumulate the hot electrons, beginning the charging process. As the charge on the floating gate increases, the electric field through oxide layer 116 decreases and eventually loses it capability of attracting any more of the hot electrons. At this point, floating gate 110 is fully charged. The charged floating gate 110 raises the memory cell's threshold voltage (Vt) above logic 1 voltage. Thus, when control gate 114 is brought to a logic 1 (H) during a read operation, the memory cell will barely turn on. As known to those skilled in the art, sense amplifiers are typically used in a memory to detect and amplify the state of the memory cell.

FIG. 1C is the memory cell of FIG. 1B during an erase operation. The memory cell is erased by discharging the floating gate. To erase the memory cell, a positive voltage of about 12 volts is applied to source 102 while control gate 114 is connected to ground and drain 104 is left unconnected, electrically floating. Alternatively, a negative voltage, such as −10 volts, can be applied to the control gate while the source is coupled to 5 volts. With a higher relative voltage at source 102, negatively-charged hot electrons 120 are attracted and tunneled to source 102 through the thin gate oxide layer 116. The tunneling is stopped when the floating gate is discharged. To avoid over erasure, the voltage applied to the source is typically applied in short pulses having equal duration and magnitude. That is, if one memory cell in a block does not fully erase during an erase operation, it is preferred to use short erase pulses to erase the memory block. The short erase pulse is an attempt to prevent over erasing memory cells in the block that are already erased. The lack of negative charge on floating gate 110 returns the memory cell's threshold voltage below logic 1 voltage. Thus, when a voltage on control gate 114 is brought to a logic 1 during a read operation, the memory cell will turn on.

FIG. 2 illustrates a portion of a memory array arranged in rows and columns. A non-volatile memory cell is located at an intersection of each row and column. Errors can be experienced during read operations when one, or more, of the memory cells have been over-erased. That is, an error can be experienced while reading memory cell 200 if memory cell 202 is over-erased. This error is due primarily to the fact that memory cells 200 and 202 are coupled to the same column during read operations. During the read operation, Row $_1$ has a signal of approximately five volts, and the source line 201 shared by a block of memory cells is coupled to ground. A state of the memory cell 200 is determined by the current flow on Column$_1$. If memory cell 202 is over erased, such that its threshold voltage is below the threshold voltage of an un-charged memory cell, the current flow on Column$_1$ is influenced by memory cell 202. Such that, memory cell 202 conducts additional current because it has a threshold voltage in the range of −1 to 0.5 volts.

In an effort to address errors resulting from over erased non-volatile memory cells, sophisticated algorithms are performed to over erase cells and then perform a heal operation to return memory cell threshold voltages to an acceptable range. In addition, unselected memory row lines can be forced to a negative voltage during read operations to force unselected cells to remain off. Both approaches require additional undesirable operating steps.

A split gate memory cell 210, illustrated in FIGS. 3A and 3B, helps address errors created by over erased memory cells. The split gate memory cell 210 includes a floating gate 212 located on an insulating layer 214. The floating gate is separated from a control gate 216 by another insulating layer 213. The control gate is fabricated in a split fashion (216 and 218), such that a traditional MOS transistor 230 is fabricated in parallel with the floating gate transistor 232. These transistors share a common drain region 220 and source region 222. If the floating gate memory cell is over erased, a current path through the series coupled transistors is not formed while the gate voltage is coupled to ground. While this memory cell helps eliminate errors due to over erased cells, it has a large cell size and substantially increases a layout of the memory array.

For the reasons stated above, and for other reasons stated below which will become apparent to those skilled in the art upon reading and understanding the present specification, there is a need in the art for a non-volatile memory device which prevents errors due to over erased memory cells without requiring sophisticated operating algorithms, or substantial increases in integrated circuit die area.

SUMMARY OF THE INVENTION

The above mentioned problems with non-volatile memory devices and other problems are addressed by the present invention and which will be understood by reading and studying the following specification. A split source line architecture is described which isolates unselected memory cells to prevent read errors.

In particular, the present invention describes a non-volatile memory device comprising an array of non-volatile memory cells arranged in rows and columns. The non-volatile memory cells have a control gate coupled to receive one of a plurality of row line signals, a drain region and a source region. A first source line is coupled to the source region of the non-volatile memory cells, and a plurality of isolation transistors are coupled to the first source line and a second source line. The plurality of isolation transistors are adapted to selectively couple the first source line to the second source line in response to one of the plurality of row line signals.

In another embodiment, a processing system comprises a processor, and a flash memory device coupled to the processor. The flash memory comprises an array of floating gate memory cells arranged in rows and columns. The floating gate memory cells each have a control gate coupled to receive one of a plurality of row line signals, a drain region coupled to a column line, and a source region coupled to a first source line. A plurality of isolation transistors are coupled to the first source line and a second source line. Each one of the plurality of isolation transistors has a gate coupled to receive one of the plurality of row line signals such that the first source line and the second source line are electrically coupled in response to one of the plurality of row line signals and unselected memory cells are isolated from the second source line.

A method is described for reducing read errors in a memory device resulting from over erased non-volatile memory cells. The method comprises initiating a read operation in the memory device, and activating a row line signal to select a row of memory cells having a source region coupled to a first source line. A first isolation transistor is activated in response to the activated row line signal to electrically couple the first source line to a second source line, and a second isolation transistor is de-activated in response to a de-activated row line signal.

DETAILED DESCRIPTION OF THE INVENTION

Figure 1A:
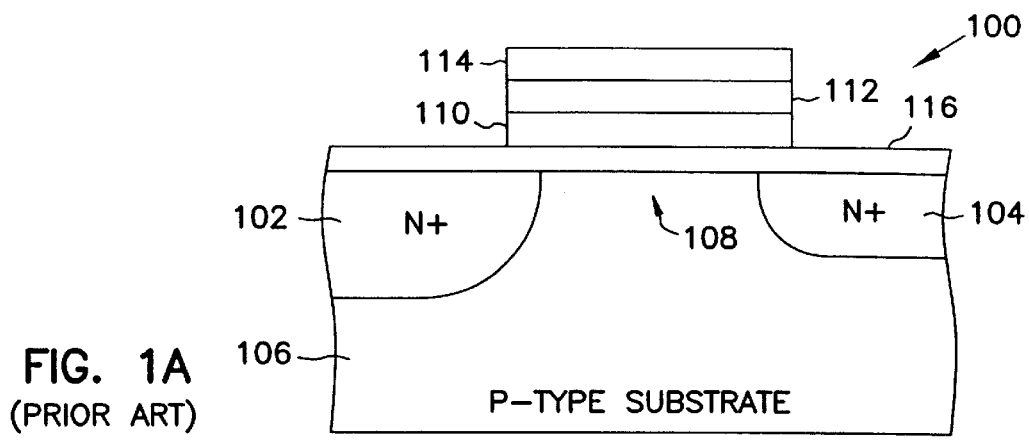
FIG. 1A is a cross section view of a prior art floating gate memory cell.
Figure 1B:
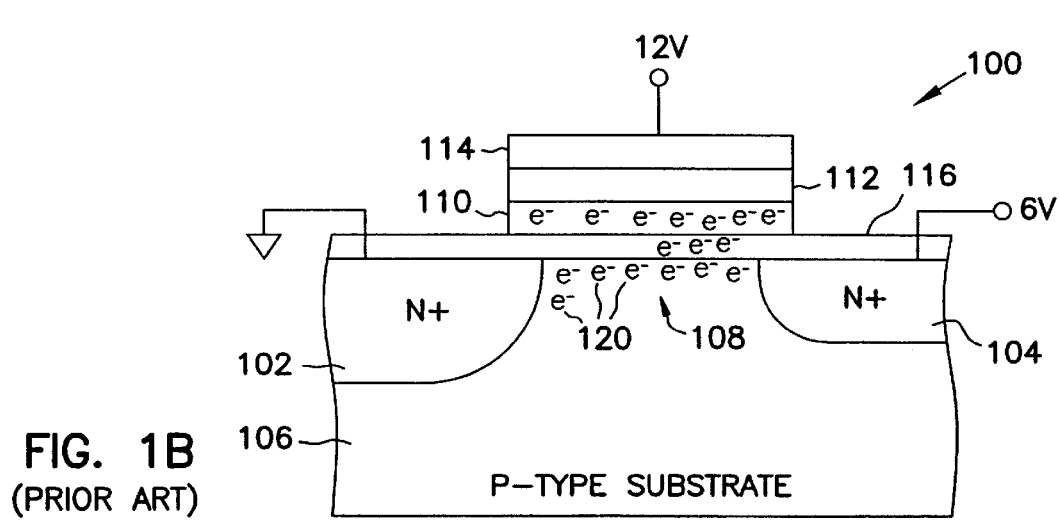
FIG. 1B is the floating gate memory cell of FIG. 1A during programming.
Figure 1C:
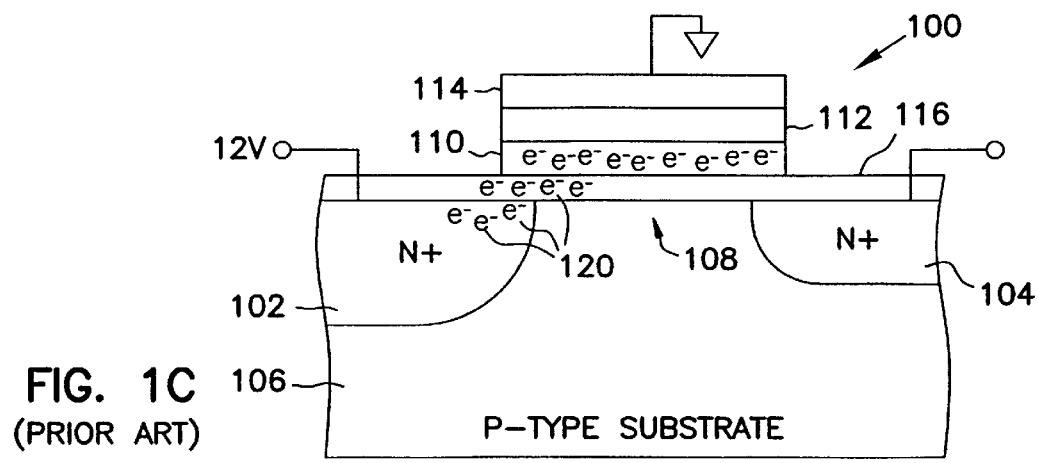
FIG. 1C is the floating gate memory cell of FIG. 1A during an erase operation.
Figure 2:
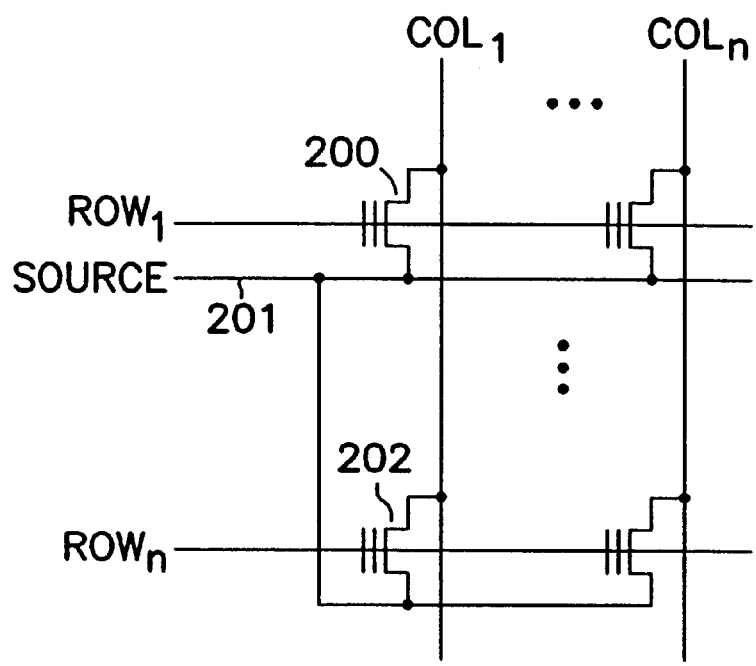
FIG. 2 is a schematic diagram of a memory array.
Figure 3A:
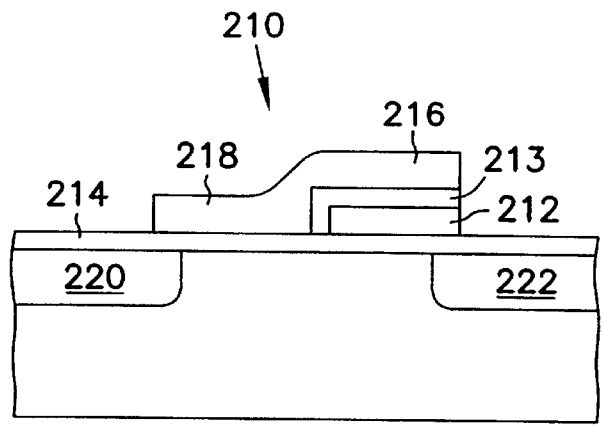
FIG. 3A is a cross section view of a split gate memory cell.
Figure 3B:
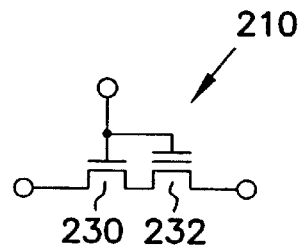
FIG. 3B is a schematic diagram of the memory cell of FIG. 3A.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

Figure 4:
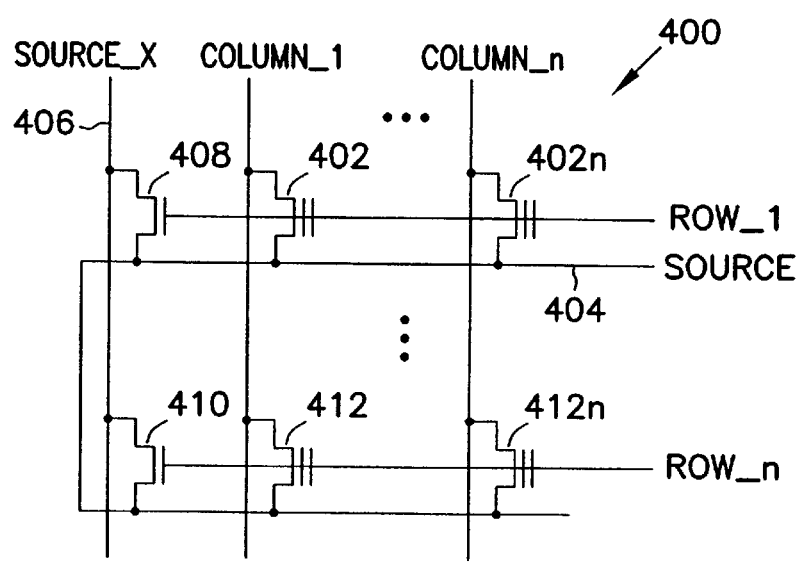
FIG. 4 is a schematic diagram of an array of the present invention.

The present invention reduces errors caused by over-erased memory cells by providing isolation transistors and a split source line architecture. Referring to FIG. 4, a portion of a memory array 400 of one embodiment of the present invention is illustrated. The memory array 400 is arranged in a plurality of columns (Column$_1$ to Column$_n$) and a plurality of rows (Row$_1$ to Row$_n$). The array 400 includes non-volatile memory cells 402 and 412. It will be appreciated by those skilled in the art, that the non-volatile memory cells can be fabricated in any known manner, and the specific fabrication of the memory cells is not critical to the present invention. Each row of the memory array 400 shares a common row line coupled to control gates of the memory cells. The row line is also coupled to a gate of an n-channel isolation transistor 408 or 410 used to couple common source line 404 to source line 406. Source line 404 is used for erasing a block of memory cells, and both source lines 404 and 406 are used in combination for programming and reading operations. Isolation transistors 408 and 410 are thick oxide transistors, without a floating gate, which allow an unselected row line, and its corresponding memory cells, to be isolated from source line 406 during read and write operations. Since only one row line in a block of cells is selected (high) during read operations, the corresponding column is isolated from source line 406 via all unselected rows to eliminate read errors due to over erased memory cells. Table 1 illustrates example voltage levels during memory operations on memory cell 402, where H indicates a high logic level above a threshold voltage of a properly erased cell and L is a low logic level below this threshold level.

TABLE 1

|  | SOURCE 404 | SOURCE$_x$ 406 | COL$_1$ | COL$_n$ | ROW$_1$ | ROW$_n$ |
|---|---|---|---|---|---|---|
| READ | GND | GND | 1 | 0 | H | L |
| WRITE | GND | GND | 5 | 0 | 12 | L |
| ERASE | 5 | 0 | 0 | 0 | −10 | −10 |

One embodiment of the present invention, therefore, isolates unselected memory array rows by providing an isolation transistor in each row, or group of n-memory cells. The isolation transistor electrically couples a shared source line 404 to a source line 406 for use during read and write operations in response to an active row signal. As shown in Table 1, Source line 404 and Source$_x$ are coupled together during read and write operations via an isolation transistor 408 or 410. During erase operations, Source line 404 is isolated from Source$_x$. Source line 404, therefore, is driven to a high voltage from a voltage source other than source line 406 during erase operations.

The isolation transistors can be integrated directly into the array with minimal area needed to fabricate. While the addition of the isolation transistors and Source$_x$ line increase the array area, the increase in the memory array area is smaller than an area required for split gate memory cells. It will be appreciated that the split source line architecture can be placed throughout the memory array in n-intervals such as every 8, 16 or 32 memory cells, or columns.

The non-volatile memory cells 402 can be fabricated and operated to store multiple bits of data per memory cell, as known to those skilled in the art. Multistate memory cells are programmed to have a threshold voltage indicative of multiple bits of data. For example, a memory cell can be programmed to have four threshold voltage ranges to store two bits of data using a binary programming code. Other programming codes can be used to store data in the memory cells without departing from the present invention. These Multi state memory cells are more susceptible to read errors caused by over erased memory cells coupled to a shared column line. That is, the storage of Multi-state data provides less margin for error during reading than memory cells which store a bi-state data bit.

Figure 5:
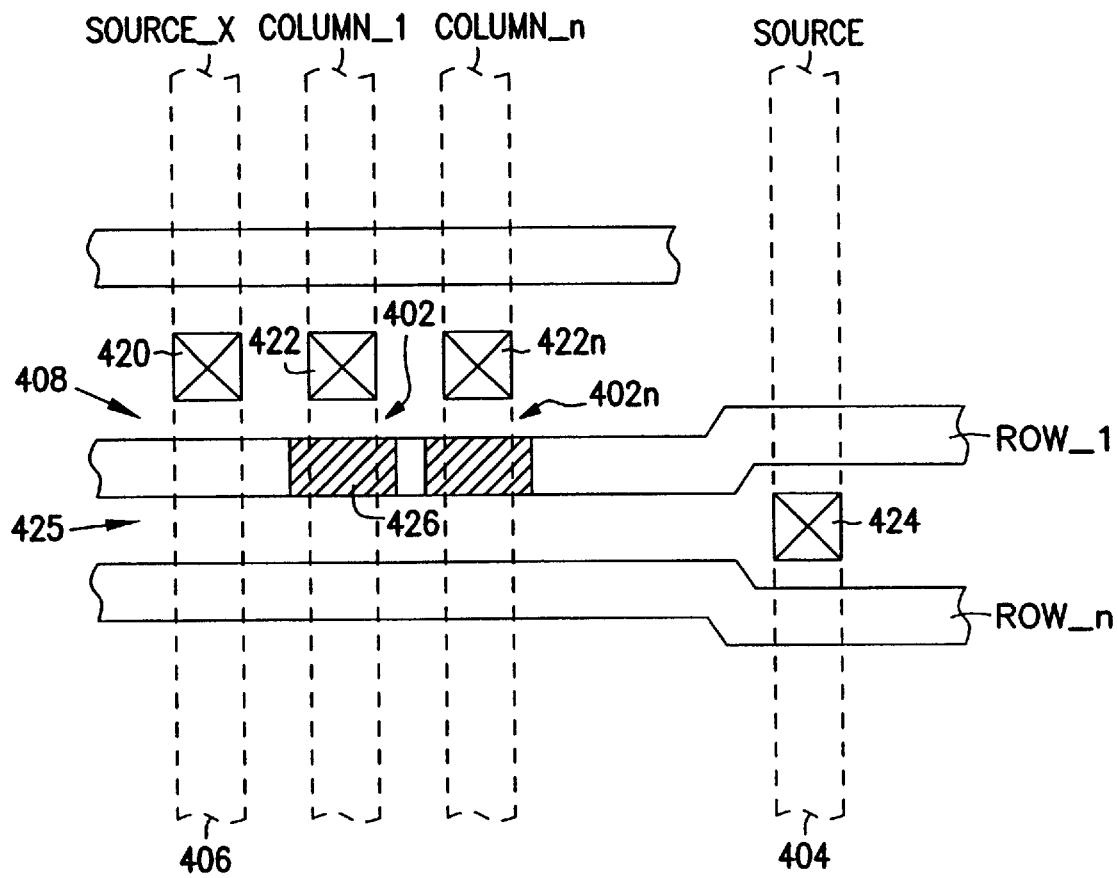
FIG. 5 is a plan view of an integrated circuit incorporating the present invention.

FIG. 5 illustrates a plan view of one integrated circuit embodiment of the present invention. Source line 404 is coupled to a block of memory cells 402 via source contacts 424 and source diffusion line 425. Drain contacts 420 and 422 are provided for coupling transistors 408 and 402 to source line 406 and Column$_1$, respectively. As described above, transistor 402 has a floating gate 426 and can be fabricated in a manner to store multiple bits of data. The source lines and columns can be fabricated as metal conductors. As illustrated, the die area penalty of the isolation transistor is small.

Figure 6:
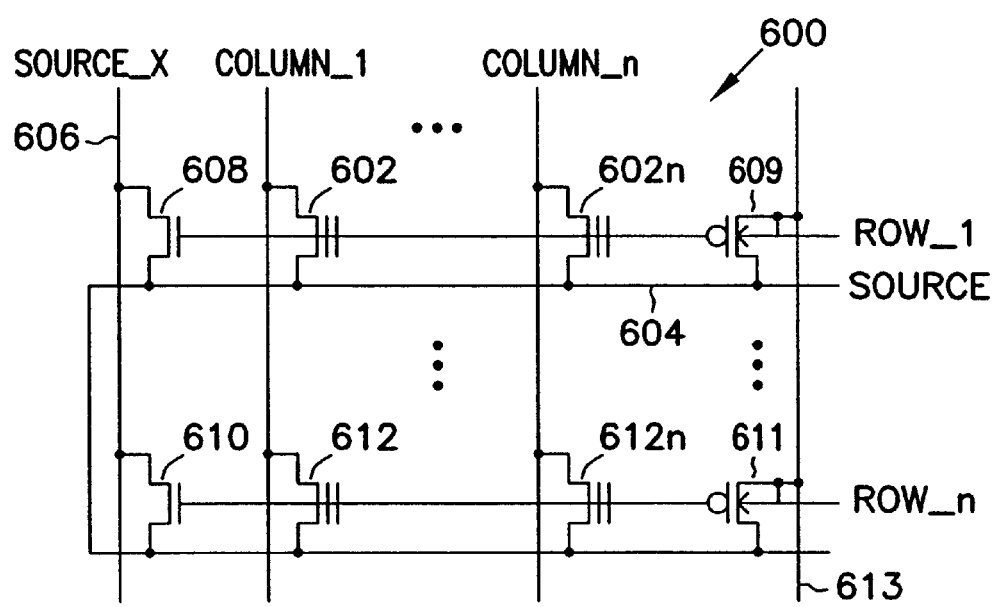
FIG. 6 is a schematic diagram of an alternate array of the present invention.

Another embodiment of the present invention also reduces errors caused by over-erased memory cells by providing additional p-channel isolation. Referring to FIG. 6, a portion of a memory array 600 of one embodiment of the present invention is illustrated. The memory array is arranged in a plurality of columns (Column$_1$ to Column$_n$) and a plurality of rows (Row$_1$ to Row$_n$). The array includes non-volatile memory cells 602 and 612. Each row of the memory array shares a common row line coupled to control gates of the memory cells. The row line is coupled to a gate of an n-channel isolation transistor 608 or 610 as described above.

The row lines are also coupled to a gate of a p-channel isolation transistor 609 or 611. Transistors 609 and 611 are used to couple source diffusion lines 604 to source metal line 613. Source line 613 is used for erasing a block of memory cells, while source line 606 is used for programming and reading operations. Although source diffusion lines 604 are shared in a manner similar to the embodiment described above, transistors 609 and 611 are used to couple source diffusion lines 604 to a source metal line 613.

Since only one row line in a block of cells is selected (high) during read operations, all but one row of memory cells in a column are isolated from source line 606. Table 2 illustrates example voltage levels during memory operations on memory cell 602, where H indicates a high logic level above a threshold voltage of a properly erased cell, and L is a low logic level below this threshold level.

TABLE 2

|  | Line 604 | Line 606 | Line 613 | COL$_1$ | COL$_n$ | ROW$_1$ | ROW$_n$ |
|---|---|---|---|---|---|---|---|
| READ | GND | GND | GND | 1 | 0 | H | L |
| WRITE | GND | GND | GND | 5 | 0 | 12 | L |
| ERASE | 5 | 0 | 5 | 0 | 0 | −10 | −10 |

Thus, during a read or write operation the source line of a selected row is coupled to source line 606 while unselected rows have a source line coupled to source line 613. During an erase operation all rows in a block are coupled to source line 613.

Figure 7:
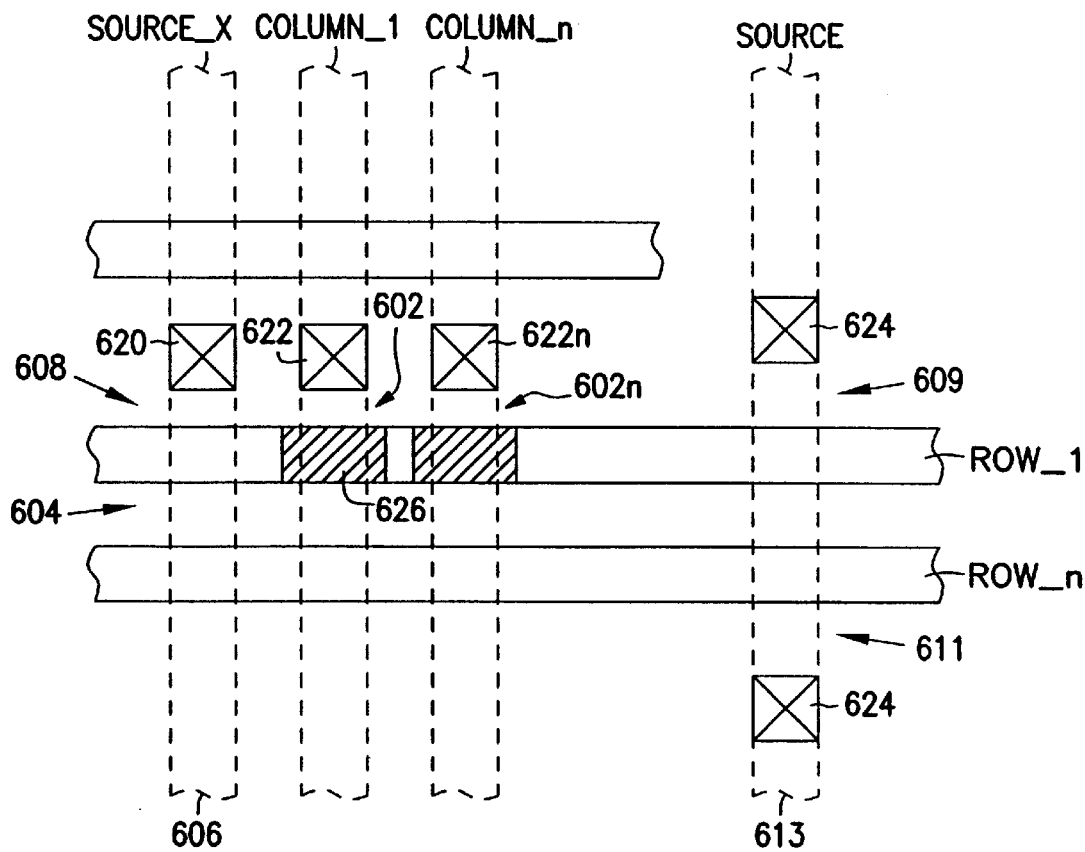
FIG. 7 is a plan view of an integrated circuit incorporating an other embodiment of the present invention.

The p-channel isolation transistors can be integrated directly into the array with minimal area needed to fabricate. FIG. 7 illustrates a plan view of one integrated circuit embodiment of the present invention. Metal source line 613 is coupled to a block of memory cells via source contacts 624 and the source diffusion lines 604. Drain contacts 620 and 622 are provided for coupling transistors 608 and 602 to source line 606 and Column$_1$, respectively. As described above, transistor 602 has a floating gate 626 and can be fabricated in a manner to store multiple bits of data. The source lines and columns can be fabricated as metal conductors. P-channel transistors 609 and 611 are formed using diffusion regions by the row lines. As illustrated, the die area penalty of the isolation transistors is small.

Figure 8:
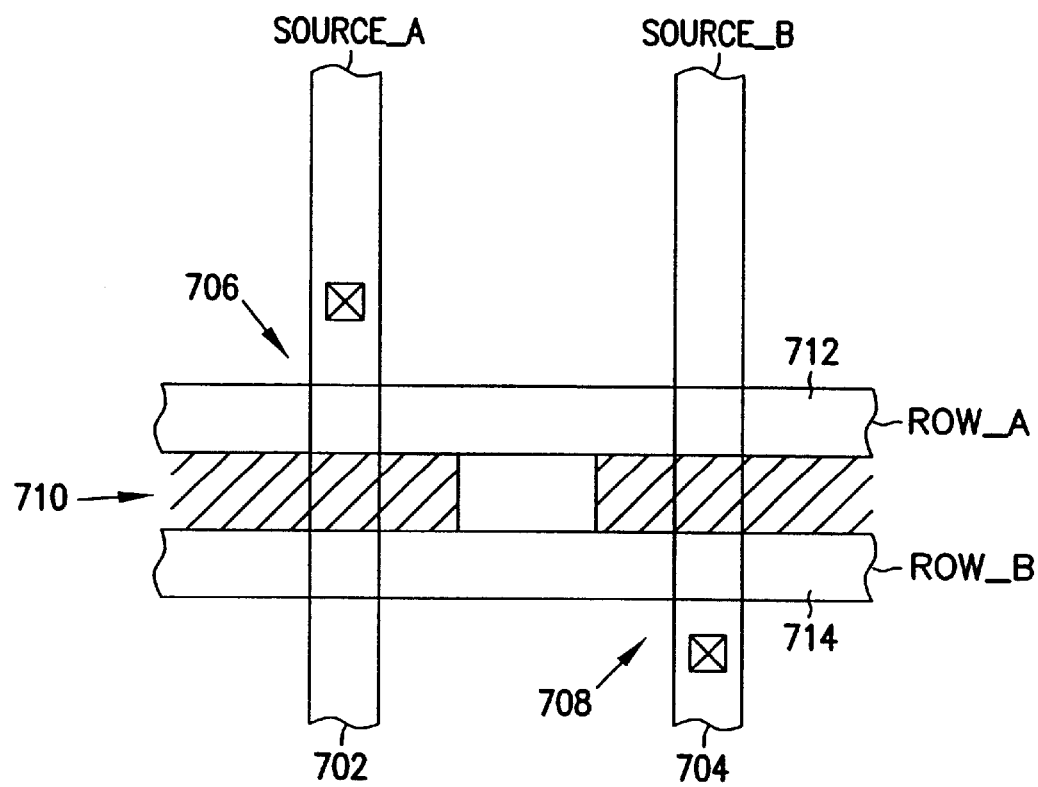
FIG. 8 is a plan view of an integrated circuit incorporating an other embodiment of the present invention.

In another embodiment, illustrated in plan view in FIG. 8, the metal source line is doubled to allow for byte erase operations. That is, multiple metal source lines 702 and 704 are provided with multiple p-channel isolation transistors 706, 708 to allow selective coupling between the metal source lines and the source diffusion line 710 of different rows 712, 714. This architecture allows EEPROM like addressability with near flash memory array efficiency. It will be appreciated that the number of metal source lines is not limited to the two illustrated.

Figure 9:
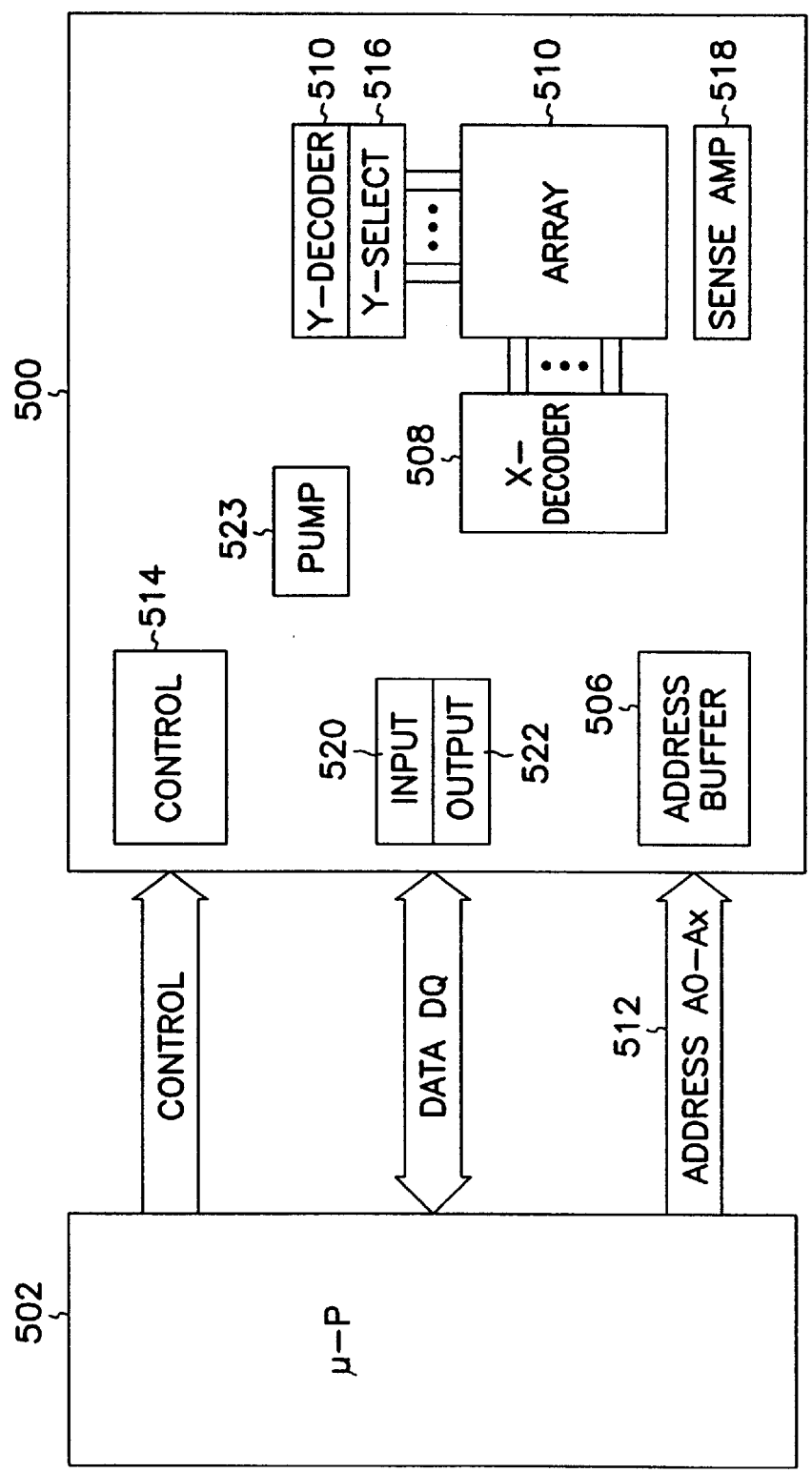
FIG. 9 is a block diagram of a memory device according to the present invention.

FIG. 9 is a block diagram of a Flash memory device 500 which is coupled to a data controller 502. The memory device has been simplified to focus on features of the memory which are helpful in understanding the present invention. The memory device 500 includes an array of memory cells 504. As described above, the memory cells are preferably floating gate memory cells. The array is arranged in rows and columns, with the rows arranged in blocks. The blocks allow memory cells to be erased in large groups, or bytes, as described above. Data, however, can be stored in the memory array in small data groups (byte or group of bytes) and separate from the block structure. Erase operations are typically performed on a large number of cells in parallel.

An x-decoder 508 and a y-decoder 510 are provided to decode address signals provided on address lines A0-Ax 512. Address signals are received and decoded to access the memory array 504. An address buffer circuit 506 is provided to latch the address signals. A y-select circuit 516 is provided to select a column of the array identified with the y-decoder 510. Sense amplifier and compare circuitry 518 is used to sense data stored in the memory cells and verify the accuracy of stored data. Data input 520 and output 522 buffer circuits are included for bi-directional data communication over a plurality of data (DQ) lines with the microprocessor 502. Command control circuit 514 decodes signals provided on control lines from the microprocessor. These signals are used to control the operations of the memory, including data read, data write, and erase operations. The flash memory can include a charge pump circuit 523 which generates a Vpp voltage used during programming of the memory cells and other internal operations.

As stated above, the Flash memory of FIG. 6 has been simplified to facilitate a basic understanding of the features of the memory. It will be appreciated that more than one Flash memory can be included in various package configurations. For example, Flash memory cards can be manufactured in varying densities using numerous Flash memories 500(1)–500(x).

Conclusion

A non-volatile memory device has been described which includes an array of memory cells arranged in rows and columns. A split source line architecture has been described which uses isolation transistors located throughout the memory array to couple selected memory cells in response to an active row line signal. The isolation transistors can be provided for each row of the memory array or for a predetermined number of memory cells, such as 8, 16 or 32. By providing a split source line and isolation transistors, read errors caused by over erased memory cells can be eliminated with minimal increase in die area.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A non-volatile memory device comprising:

an array of non-volatile memory cells arranged in rows and columns, each non-volatile memory cell having a control gate coupled to receive one of a plurality of row line signals, a drain region and a source region;

a first source line coupled to the source regions of the non-volatile memory cells in a plurality of rows of non-volatile memory cells;

a plurality of n-channel isolation transistors coupled to the first source line and a second source line, the plurality of n-channel isolation transistors adapted to selectively couple the first source line to the second source line in response to one of the plurality of row line signals; and a plurality of p-channel isolation transistors coupled to the first source line and a third source line, the plurality of p-channel isolation transistors adapted to selectively couple the first source line to the second source line in response to one of the plurality of row line signals.

2. The non-volatile memory device of claim 1 wherein each one of the non-volatile memory cells are adapted to store multiple bits of data.

3. The non-volatile memory device of claim 1 wherein the third source line is fabricated from a metal material.

4. The non-volatile memory device of claim 1 further comprising control circuitry for performing read, write and erase operations on the memory cells, during the read and write operations the controller activates the n-channel transistors to couple the first source line of a selected row of memory cells to the second source line, during the erase operation the controller activates the p-channel transistors to couple a source line of unselected rows of memory cells to the third source line.

5. A processing system comprising:

a processor; and a flash memory device coupled to the processor and comprising, an array of floating gate memory cells arranged in rows and columns, the floating gate memory cells each having a control gate coupled to receive one of a plurality of row line signals, a drain region coupled to a column line, and a source region coupled to a first source line which is coupled to a plurality of rows of floating gate memory cells, a plurality of n-channel isolation transistors coupled to the first source line and a second source line, each one of the plurality of n-channel isolation transistors having a gate coupled to receive one of the plurality of row line signals such that the first source line and the second source line are electrically coupled in response to one of the plurality of row line signals, and a plurality of p-channel isolation transistors coupled to the first source line and a third source line, each one of the plurality of p-channel isolation transistors having a gate coupled to receive one of the plurality of row line signals such that the first source line and the third source line are electrically coupled in response to one of the plurality of row line signals.

6. The processing system of claim 5 wherein each one of the plurality of n-channel isolation transistors corresponds to n-memory cells, such that the one of the plurality of n-channel isolation transistors can couple one of the n-memory cells to the second source line.

7. The processing system of claim 6, wherein the n-memory cells comprise either 8, 16, or 32 memory cells.

8. The processing system of claim 6, wherein each one of the floating gate memory cells is adapted to store multiple bits of data.

9. The processing system of claim 5 wherein each one of the plurality of p-channel isolation transistors corresponds to n-memory cells, such that the one of the plurality of p-channel isolation transistors can couple one of the n-memory cells to the third source line.

10. The processing system of claim 9, wherein the n-memory cells comprise either 8, 16, or 32 memory cells.

11. The processing system of claim 9, wherein each one of the floating gate memory cells is adapted to store multiple bits of data.

12. The processing system of claim 5, wherein each one of the floating gate memory cells is adapted to store multiple bits of data.

13. A method of reducing read errors in a memory device resulting from over erased non-volatile memory cells, the method comprising:
    initiating a read operation in the memory device;
    activating a row line signal to select a row of memory cells having source regions coupled to a first source line common to a plurality of rows;
    activating a first isolation transistor in response to the activated row line signal to electrically couple the first source line to a second source line; and
    activating a second isolation transistor in response to a de-activated row line signal to electrically couple the first source line of an unselected row of memory cells to a third source line.

14. The method of claim 13 wherein the first isolation transistors are n-channel transistors activated in response to an active high row line signal.

15. The method of claim 13 wherein the second isolation transistors are p-channel transistors activated in response to a low row line signal.

16. The method of claim 13, further comprising using the first isolation transistor to couple one of n-memory cells to the second source line.

17. The method of claim 16, wherein the n-memory cells comprise either 8, 16, or 32 memory cells.

18. The method of claim 13, further comprising storing multiple bits of data in at least one of the non-volatile memory cells.

19. A flash memory, comprising:
    an array of floating gate memory cells arranged in rows and columns, and controlled by a plurality of row signals and a plurality of column signals, each of the floating gate memory cells having:
        a control gate connected to a row line to receive one of the plurality of row line signals,
        a drain region connected to a column line for each of the column signals, and
        a source region connected to a first source line common to a plurality of rows, a plurality of n-channel isolation transistors coupled to the first source line and a second source line, each one of the plurality of n-channel isolation transistors having a gate coupled to receive one of the plurality of row line signals such that the first source line and the second source line are electrically coupled in response to one of the plurality of row line signals, and
    a plurality of p-channel isolation transistors coupled to the first source line and a third source line, each one of the plurality of p-channel isolation transistors having a gate coupled to receive one of the plurality of row line signals such that the first source line and the third source line are electrically coupled in response to one of the plurality of row line signals.

20. The flash memory of claim 19 wherein each one of the plurality of n-channel isolation transistors corresponds to n-memory cells, such that the one of the plurality of n-channel isolation transistors can couple one of the n-memory cells to the second source line.

21. The flash memory of claim 19 wherein each one of the plurality of p-channel isolation transistors corresponds to n-memory cells, such that the one of the plurality of p-channel isolation transistors can couple one of the n-memory cells to the third source line.

22. A flash memory device, comprising,
    an array of floating gate memory cells arranged in rows and columns, the floating gate memory cells each having a control gate coupled to receive one of a plurality of row line signals, a drain region coupled to a column line, and a source region coupled to a first source line which is coupled to a plurality of rows of floating gate memory cells,
    a plurality of n-channel isolation transistors coupled to the first source line and a second source line, each one of the plurality of n-channel isolation transistors having a gate coupled to receive one of the plurality of row line signals such that the first source line and the second source line are electrically coupled in response to one of the plurality of row line signals, and
    a plurality of p-channel isolation transistors coupled to the first source line and a third source line, each one of the plurality of p-channel isolation transistors having a gate coupled to receive one of the plurality of row line signals such that the first source line and the third source line are electrically coupled in response to one of the plurality of row line signals.

23. A flash memory device, comprising,
    an array of floating gate memory cells arranged in rows and columns, the floating gate memory cells each having a control gate coupled to receive one of a plurality of row line signals, a drain region coupled to a column line, and a source region coupled to a first source line which is coupled to a plurality of rows of floating gate memory cells,
    a plurality of first isolation transistors coupled to the first source line and a second source line, each one of the plurality of first isolation transistors having a gate coupled to receive one of the plurality of row line signals such that the first source line and the second source line are electrically coupled in response to one of the plurality of row line signals, and
    a plurality of second isolation transistors coupled to the first source line and a third source line, each one of the plurality of second isolation transistors having a gate coupled to receive one of the plurality of row line signals such that the first source line and the third source line are electrically coupled in response to one of the plurality of row line signals.

24. A processing system comprising:

a processor; and a flash memory device coupled to the processor and comprising, an array of floating gate memory cells arranged in rows and columns, the floating gate memory cells each having a control gate coupled to receive one of a plurality of row line signals, a drain region coupled to a column line, and a source region coupled to a first source line common to a plurality of rows;

a plurality of first isolation transistors coupled to the first source line and a second source line, each one of the plurality of first isolation transistors having a gate coupled to receive one of the plurality of row line signals such that the first source line and the second source line are electrically coupled in response to one of the plurality of row line signals, and a plurality of second isolation transistors coupled to the first source line and a third source line, each one of the plurality of second isolation transistors having a gate coupled to receive one of the plurality of row line signals such that the first source line and the third source line are electrically coupled in response to one of the plurality of row line signals.

25. A non-volatile memory device comprising:

an array of non-volatile memory cells arranged in rows and columns, each non-volatile memory cell having a control gate coupled to receive one of a plurality of row line signals, a drain region and a source region;

a first source line coupled to the source regions of the non-volatile memory cells in a plurality of rows of non-volatile memory cells;

a plurality of first isolation transistors coupled to the first source line and a second source line, the plurality of first isolation transistors adapted to selectively couple the first source line to the second source line in response to one of the plurality of row line signals; and a plurality of second isolation transistors coupled to the first source line and a third source line, the plurality of second isolation transistors adapted to selectively couple the first source line to the second source line in response to one of the plurality of row line signals.

* * * * *